(12) United States Patent
Shao et al.

(10) Patent No.: US 12,107,089 B2
(45) Date of Patent: Oct. 1, 2024

(54) OXIDE THIN FILM TRANSISTOR AND METHOD FOR DRIVING THE SAME, DISPLAY DEVICE

(71) Applicants: WUHAN BOE OPTOELECTRONICS TECHNOLOGY CO., LTD., Hubei (CN); BOE TECHNOLOGY GROUP CO., LTD., Beijing (CN)

(72) Inventors: Xibin Shao, Beijing (CN); Yanping Liao, Beijing (CN); Huibin Guo, Beijing (CN)

(73) Assignees: WUHAN BOE OPTOELECTRONICS TECHNOLOGY CO., LTD., Hubei (CN); BOE TECHNOLOGY GROUP CO., LTD., Beijing (CN)

( * ) Notice: Subject to any disclaimer, the term of this patent is extended or adjusted under 35 U.S.C. 154(b) by 601 days.

(21) Appl. No.: 17/294,968

(22) PCT Filed: Sep. 2, 2020

(86) PCT No.: PCT/CN2020/113042
§ 371 (c)(1),
(2) Date: May 18, 2021

(87) PCT Pub. No.: WO2021/068688
PCT Pub. Date: Apr. 15, 2021

(65) Prior Publication Data
US 2022/0013544 A1 Jan. 13, 2022

(30) Foreign Application Priority Data
Oct. 12, 2019 (CN) .......................... 201910968517.2

(51) Int. Cl.
*H01L 27/12* (2006.01)
*H01L 29/786* (2006.01)

(52) U.S. Cl.
CPC ...... *H01L 27/1225* (2013.01); *H01L 29/7869* (2013.01)

(58) Field of Classification Search
CPC ............... H01L 27/1225; H01L 27/124; H01L 27/0207; H01L 29/7869; H01L 29/66969
See application file for complete search history.

(56) References Cited

U.S. PATENT DOCUMENTS 8,242,837 B2 * 8/2012 Yamazaki ............. H01L 33/025
 327/566
9,130,047 B2 * 9/2015 Sakakura ............ H01L 27/1225
(Continued)

FOREIGN PATENT DOCUMENTS

| CN | 102522411 A | 6/2012 |
| CN | 107946315 A | 4/2018 |

(Continued)

OTHER PUBLICATIONS

International Search Report and Written Opinion for Application No. PCT/CN2020/113042, dated Dec. 7, 2020, 9 Pages.

*Primary Examiner* — Vincent Wall
(74) *Attorney, Agent, or Firm* — Brooks Kushman P.C.

(57) ABSTRACT

An oxide thin film transistor includes a gate electrode, and a first active layer structure and a second active layer structure arranged subsequently, the first active layer structure includes a first conductive connection portion and a second conductive connection portion arranged oppositely, the second active layer structure includes a third conductive connection portion and a fourth conductive connection portion arranged oppositely, and the second oxide semiconductor pattern respectively coupled to the third conductive connection portion and the fourth conductive connection (Continued)

portion, and an orthographic projection of the first oxide semiconductor pattern on the substrate and an orthographic projection of the second oxide semiconductor pattern on the substrate are both located within an orthographic projection of the gate electrode on the substrate, the second conductive connection portion is coupled to the third conductive connection portion.

7 Claims, 5 Drawing Sheets

(56) References Cited

U.S. PATENT DOCUMENTS

| | | | |
|---|---|---|---|
| 11,764,074 B2* | 9/2023 | Yamazaki | H01L 21/477 257/43 |
| 2008/0002084 A1* | 1/2008 | Park | G02F 1/136213 349/43 |
| 2008/0036698 A1* | 2/2008 | Kawasaki | G02F 1/1368 345/55 |
| 2008/0128689 A1* | 6/2008 | Lee | H01L 29/7869 257/43 |
| 2008/0128705 A1* | 6/2008 | Ishiguro | H01L 29/78645 257/72 |
| 2010/0237352 A1* | 9/2010 | Sele | H01L 27/124 257/E29.292 |
| 2010/0289832 A1* | 11/2010 | Yamamoto | G09G 3/3233 345/77 |
| 2014/0176494 A1* | 6/2014 | Huang | G02F 1/13394 345/174 |
| 2015/0034945 A1* | 2/2015 | Sakakura | H01L 29/7831 257/43 |
| 2016/0126101 A1* | 5/2016 | Ellinger | H01L 21/02178 438/586 |

FOREIGN PATENT DOCUMENTS

| | | |
|---|---|---|
| CN | 110600488 A | 12/2019 |
| EP | 1006589 A2 | 6/2000 |

* cited by examiner

OXIDE THIN FILM TRANSISTOR AND METHOD FOR DRIVING THE SAME, DISPLAY DEVICE

CROSS-REFERENCE TO RELATED APPLICATIONS

This application is the U.S. national phase of PCT Application No. PCT/CN2020/113042 filed on Sep. 2, 2020, which claims priority to Chinese Patent Application No. CN 201910968517.2 filed on Oct. 12, 2019, which are incorporated herein by reference in their entireties.

TECHNICAL FIELD

The present disclosure relates to the field of TFT technology, in particular to an oxide thin film transistor, a method for driving the same and a display device.

BACKGROUND

Oxide thin film transistor (Oxide TFT) is a special type of field effect transistor. When manufacturing an Oxide TFT, the semiconductor active layer and dielectric are deposited on the substrate in the form of a thin film. Oxide TFTs have become the first choice for display panels with large size, high resolution, low power consumption, and narrow frame due to their advantages of high electron mobility, low off-state current, and simple manufacturing process.

SUMMARY

In a first aspect, the present disclosure provides in some embodiments an oxide thin film transistor including: a gate electrode arranged on a substrate; and at least two active layer structures, wherein the at least two active layer structures include a first active layer structure and a second active layer structure, the first active layer structure includes a first conductive connection portion and a second conductive connection portion arranged oppositely, and a first oxide semiconductor pattern arranged between the first conductive connection portion and the second conductive connection portion, the first oxide semiconductor pattern is respectively coupled to the first conductive connection portion and the second conductive connection portion, the second active layer structure includes a third conductive connection portion and a fourth conductive connection portion arranged oppositely, and a second oxide semiconductor pattern arranged between the third conductive connection portion and the fourth conductive connection portion, and the second oxide semiconductor pattern is respectively connected to the third conductive connection portion and the fourth conductive connection portion, and an orthographic projection of the first oxide semiconductor pattern on the substrate and an orthographic projection of the second oxide semiconductor pattern on the substrate are both located within an orthographic projection of the gate electrode on the substrate, the second conductive connection portion is coupled to the third conductive connection portion.

Optionally, an orthographic projection of the first conductive connection portion on the substrate and the orthographic projection of the first oxide semiconductor pattern on the substrate have a first overlapping area; an orthographic projection of the second conductive connection portion on the substrate and the orthographic projection of the first oxide semiconductor pattern on the substrate have a second overlapping area; an orthographic projection of the third conductive connection portion on the substrate and the orthographic projection of the second oxide semiconductor pattern on the substrate have a third overlapping area; an orthographic projection of the fourth conductive connecting portion on the substrate and the orthographic projection of the second oxide semiconductor pattern on the substrate have a fourth overlapping area; the second overlapping area and the third overlapping area are located between the first overlapping area and the fourth overlapping area.

Optionally, the thin film transistor further includes a first lapping portion, and the second conductive connection portion and the third conductive connection portion are coupled to each other through the first lapping portion, and an orthographic projection of the first lapping portion on the substrate does not overlap the orthographic projection of the first oxide semiconductor pattern on the substrate, and does not overlap with the orthographic projection of the second oxide semiconductor pattern on the substrate.

Optionally, the first oxide semiconductor pattern and the second oxide semiconductor pattern are sequentially arranged along a first direction, and are staggered along a second direction perpendicular to the first direction.

Optionally, an orthographic projection of the first oxide semiconductor pattern in the second direction and an orthographic projection of the second oxide semiconductor pattern in the second direction have a fifth overlapping areas, the second conductive connection portion, the first lapping portion, and the third conductive connection portion are formed as an integrated in-line structure extending along the second direction.

Optionally, a size of the fifth overlapping area in the first direction is the same as a width of the integrated in-line structure in the first direction.

Optionally, the first oxide semiconductor pattern and the second oxide semiconductor pattern are formed as an integrated structure, and the second conductive connection portion is multiplexed as the third conductive connection portion.

Optionally, the at least two active layer structures extend along a first direction, the first conductive connection portion includes a first portion and a second portion, the first portion extends along a second direction perpendicular to the first direction, the second portion is extended from the first portion along the second direction, an orthographic projection of the first portion on the substrate and the orthographic projection of the first oxide semiconductor pattern on the substrate have the first overlapping area, and an orthographic projection of the second portion on the substrate does not overlap the orthographic projection of the first oxide semiconductor pattern on the substrate.

Optionally, the first portion and the second portion form an integrated strip structure along the second direction.

Optionally, a width of the first overlapping area is the same as a width of the integrated strip structure in the first direction.

Optionally, the at least two active layer structures extend along a first direction, the fourth conductive connection portion includes a third portion and a fourth portion, the third portion extends along a second direction perpendicular to the first direction, an orthographic projection of the third portion on the substrate and the orthographic projection of the second oxide semiconductor pattern on the 1 partially overlap to form a fourth overlapping area; the fourth portion extends along the first direction, an orthographic projection of the fourth portion on the substrate and the orthographic projection of the second oxide semiconductor pattern on the substrate do not overlap, and the fourth portion is coupled to a first end of the third portion, and an orthographic projection of the first end on the substrate and the orthographic projection of the second oxide semiconductor pattern on the substrate do not overlap.

Optionally, the third portion includes a first sub-portion and a second sub-portion, an orthographic projection of the first sub-portion on the substrate and the orthographic projection of the second oxide semiconductor pattern on the substrate have the fourth overlapping area, an orthographic projection of the second sub-portion on the substrate and the orthographic projection of the second oxide semiconductor pattern on the substrate do not overlap.

Optionally, the third portion and the fourth portion are collectively formed as an L-shaped pattern or a T-shaped pattern.

Optionally, a width of the fourth overlapping region is the same as a width of the third portion in the first direction.

Optionally, the third portion and the fourth portion are formed as an integral structure.

Optionally, the first oxide semiconductor pattern and the second oxide semiconductor pattern are sequentially arranged along a first direction, an orthographic projection of the first conductive connection portion on the substrate and the orthographic projection of the first oxide semiconductor pattern on the substrate have a first overlapping area; an orthographic projection of the second conductive connection portion on the substrate and the orthographic projection of the first oxide semiconductor pattern on the substrate have a second overlapping area; an orthographic projection of the third conductive connection portion on the substrate and the orthographic projection of the second oxide semiconductor pattern on the substrate 1 have a third overlapping area; an orthographic projection of the fourth conductive connecting portion on the substrate and the orthographic projection of the second oxide semiconductor pattern on the substrate 1 have a fourth overlapping area; in a second direction perpendicular to the first direction, the second overlapping area and the third overlapping area are located on a first side of the first oxide semiconductor pattern, and the first overlapping area and the fourth overlapping area are located on a second side of the second oxide semiconductor pattern, and the first side and the second side are opposite to each other.

Optionally, the thin film transistor further includes a second lapping portion, and the second conductive connection portion and the third conductive connection portion are coupled to each other through the second lapping portion, an orthographic projection of the second lapping portion on the substrate does not overlap the orthographic projection of the first oxide semiconductor pattern on the substrate, and does not overlap the orthographic projection of the second oxide semiconductor pattern on the substrate.

Optionally, the second conductive connection portion, the second lapping portion, and the third conductive connection portion are formed in an integrated in-line structure along the first direction.

Optionally, the first conductive connection portion includes a fifth portion and a sixth portion coupled to each other, and the fifth portion extends along the first direction, an orthographic projection of the fifth portion on the substrate and the orthographic projection of the first oxide semiconductor pattern on the substrate have the first overlapping area; the sixth portion extends along the second direction, an orthographic projection of the sixth portion on the substrate and the orthographic projection of the first oxide semiconductor pattern on the substrate do not overlap.

Optionally, the sixth portion is coupled to a first end of the fifth portion, and an orthographic projection of the first end on the substrate and the orthographic projection of the first oxide semiconductor pattern on the substrate do not overlap, a first conductive connecting portion formed after the fifth portion is coupled to the sixth portion is of an L shape or T shape.

Optionally, the fourth conductive connecting portion includes a seventh portion, an eighth portion, and a ninth portion; the seventh portion extends along the first direction, and an orthographic projection of the seventh portion on the substrate and the orthographic projection of the second oxide semiconductor pattern on the substrate have the fourth overlapping area; the ninth portion extends along the first direction, an orthographic projection of the ninth portion on the substrate and the orthographic projection of the second oxide semiconductor pattern on the substrate do not overlap; the eighth portion extends along the second direction, an orthographic projection of the eighth portion on the substrate is located between the orthographic projection of the seventh portion on the substrate and the orthographic projection of the ninth portion on the substrate, and does not overlap the orthographic projection of the second oxide semiconductor pattern on the substrate, the seventh portion is coupled to the ninth portion through the eighth portion.

Optionally, along the second direction, a width of the ninth portion is greater than a width of the seventh portion.

Optionally, the seventh portion, the eighth portion, and the ninth portion form an integral structure.

Optionally, the first oxide semiconductor pattern and the second oxide semiconductor pattern are arranged at a same layer and made of a same material.

Optionally, the first conductive connection portion, the second conductive connection portion, the third conductive connection portion, and the fourth conductive connection portion are arranged at a same layer and made of a same material.

In a second aspect, the present disclosure provides in some embodiments a display device including the above-mentioned oxide thin film transistor.

In a third aspect, the present disclosure provides in some embodiments a method of driving the above oxide thin film transistor, the method includes applying a driving signal to the gate electrode of the oxide thin film transistor, the second conductive connection portion included in the first active layer structure, and the fourth conductive connection portion included in the second active layer structure, so that the oxide thin film transistor is turned on.

BRIEF DESCRIPTION OF THE DRAWINGS

The drawings described here are used to provide a further understanding of the present disclosure and constitute a part of the present disclosure. The exemplary embodiments of the present disclosure are used to explain the present disclosure, and do not constitute an improper limitation of the present disclosure.

DETAILED DESCRIPTION

In order to further illustrate an oxide thin film transistor, a driving method thereof, and a display device provided by the embodiments of the present disclosure, a detailed description will be given below with reference to the accompanying drawings.

In the process of manufacturing the oxide thin film transistor in the related art, due to the instability of the manufacturing process of the oxide active layer, the oxide active layer is prone to local degradation, which affects the yield of the display panel.

When the oxide semiconductor pattern in the Oxide TFT is locally deteriorated, it will cause the display panel to have driving bright spots and sand mura defects. The basic reason for these defects is that the deterioration of the oxide semiconductor pattern (as the active layer of the oxide thin film transistor) will cause the initial threshold voltage Vth in the characteristic curve of the Oxide TFT to shift to the left, and the off-state current Ioff of the Oxide TFT to be too large. As a result, when the Oxide TFT is used to drive the pixel to emit light, the pixel will be continuously driven to produce driving bright spots and sand mura defects.

When the oxide semiconductor pattern in Oxide TFT is locally deteriorated, the degradation range is very small, only a few microns, and therefore only affects a single Oxide TFT. Therefore, in the present disclosure, Oxide TFT includes a plurality of oxide semiconductor patterns connected in series, that is, one Oxide TFT is set to include a plurality of sub-Oxide TFTs connected in series, so that when the oxide semiconductor pattern in one sub-Oxide TFT deteriorates, the good work performance of the Oxide TFT can be ensured.

Figure 1:
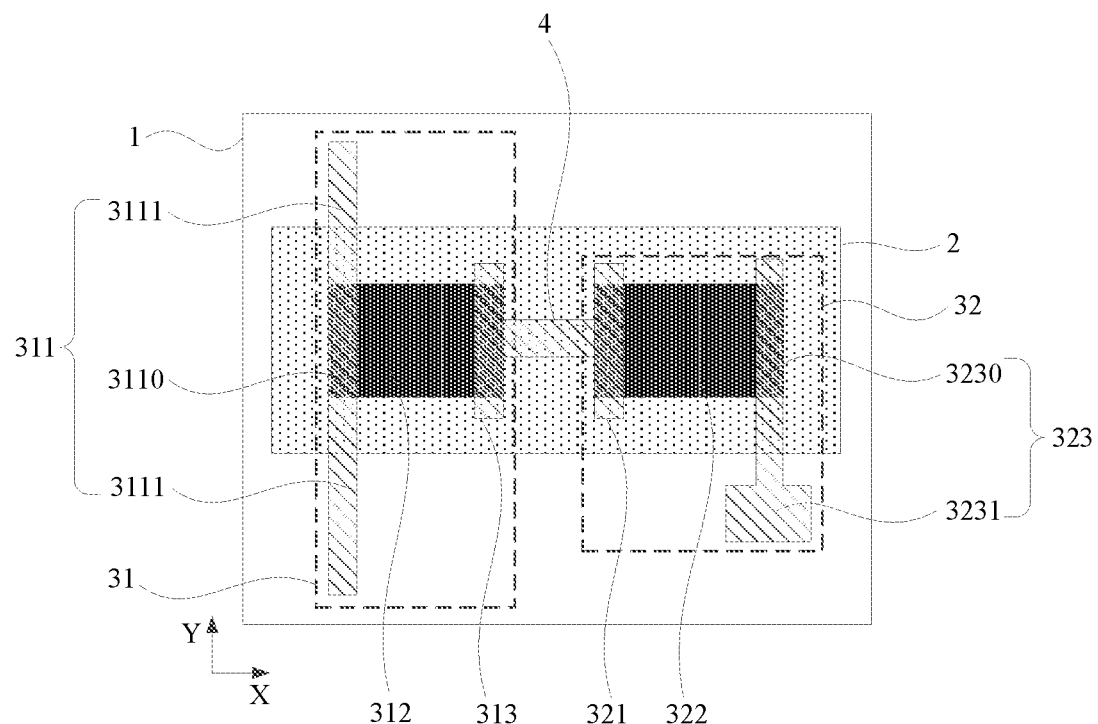
FIG. 1 is a schematic diagram of an oxide thin film transistor in a first structure according to an embodiment of the present disclosure.
Figure 2:
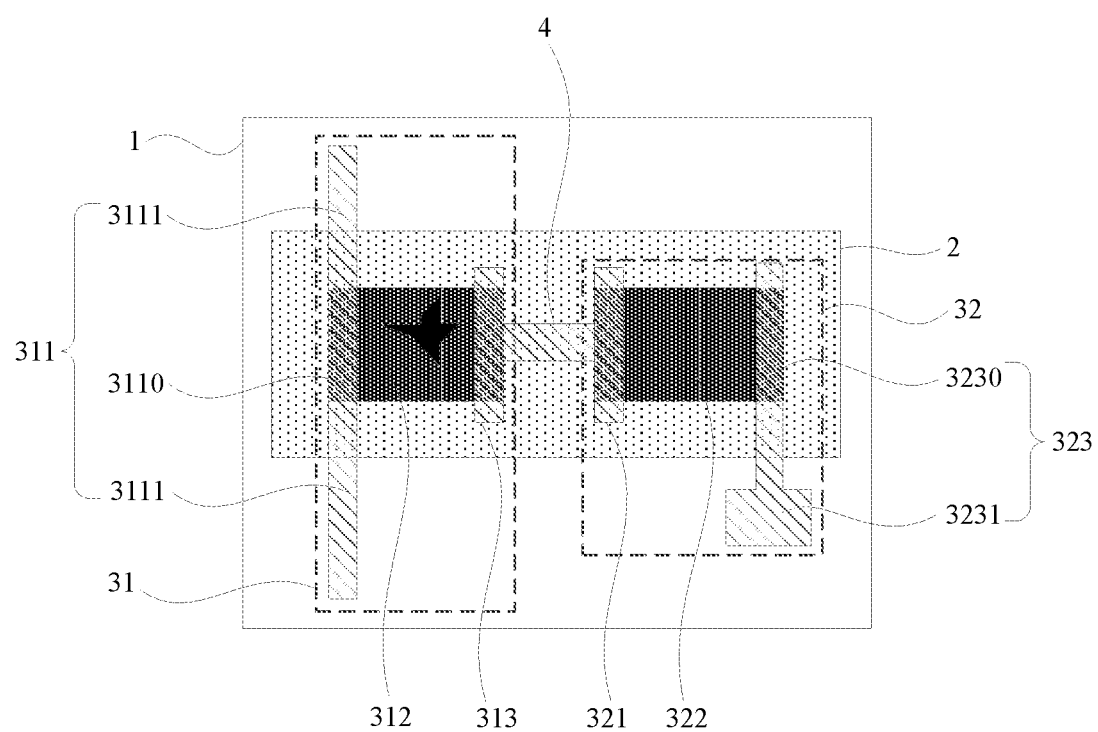
FIG. 2 is a schematic diagram of the deterioration of an active layer of the oxide thin film transistor in the first structure.

Referring to FIG. 1 and FIG. 2, an embodiment of the present disclosure provides an oxide thin film transistor, including: a gate electrode 2 arranged on a substrate 1; and at least two active layer structures. The at least two active layer structures include a first active layer structure 31 and a second active layer structure 32, and the first active layer structure 31 includes: a first conductive connection portion 311 and a second conductive connection portion 313 arranged oppositely, and a first oxide semiconductor pattern 312 arranged between the first conductive connection portion 311 and the second conductive connection portion 313, the first oxide semiconductor pattern 312 is respectively coupled to the first conductive connection portion 311 and the second conductive connection portion 313; the second active layer structure 32 includes: a third conductive connection portion 321 and a fourth conductive connection portion 323 arranged oppositely, and a second oxide semiconductor pattern 322 arranged between the third conductive connection portion 321 and the fourth conductive connection portion 323, and the second oxide semiconductor pattern 322 is respectively connected to the third conductive connection portion 321 and the fourth conductive connection portion 323; an orthographic projection of the first oxide semiconductor pattern 312 on the substrate 1 and an orthographic projection of the second oxide semiconductor pattern 322 on the substrate 1 are both located within an orthographic projection of the gate electrode 2 on the substrate 1, the second conductive connection portion 313 is coupled to the third conductive connection portion 321.

Specifically, the material of the substrate 1 can be selected according to actual needs. Illustratively, a glass substrate 1 or a flexible substrate 1 of other materials is selected. When an oxide thin film transistor is manufactured on the substrate 1, a buffer layer, a light-shielding layer and other film layers are formed on the substrate 1 first. Then an oxide thin film transistor is continued to be manufactured on a side of the substrate 1 where the buffer layer and the light-shielding layer are formed. When an oxide thin film transistor is manufactured, for example, the gate electrode 2 and the at least two active layer structures that are arranged in a stack may be sequentially formed along a direction away from the substrate 1.

The number of the active layer structures can be set according to actual needs. Illustratively, the at least two active layer structures can be set to include a first active layer structure 31 and a second active layer structure 32. The first active layer structure 31 includes a first conductive connection portion 311 and a second conductive connection portion 313 arranged oppositely in a direction parallel to the substrate 1, and further includes the first oxide semiconductor pattern 312 arranged between the first conductive connection portion 311 and the second conductive connection portion 313. The first oxide semiconductor pattern 312 is respectively coupled to the first conductive connection portion 311 and the second conductive connection portion 313. The second active layer structure 32 includes a third conductive connection portion 321 and a fourth conductive connection portion 323 arranged oppositely in a direction parallel to the substrate 1, and further includes the second oxide semiconductor pattern 322 arranged between the third conductive connection portion 321 and the fourth conductive connection portion 323. The second oxide semiconductor pattern 322 is respectively coupled to the third conductive connection portion 321 and the fourth conductive connection portion 323.

When the at least two active layer structures include the first active layer structure 31 and the second active layer structure 32, the first conductive connection portion 311 in the first active layer structure 31 and the fourth conductive connection portion 323 in the second active layer structure 32 are used as two electrodes (such as a source electrode and a drain electrode) of the oxide thin film transistor.

It is worth noting that the first conductive connection portion 311 and the second conductive connection portion 313 may be formed of a separate conductive material, or may be formed by doping opposite ends of the first oxide semiconductor pattern 312. Similarly, the third conductive connection portion 321 and the fourth conductive connection portion 323 may be formed of a separate conductive material, or may be formed by doping opposite ends of the second oxide semiconductor pattern 322.

In the oxide thin film transistor of the above structure, the orthographic projection of the first oxide semiconductor pattern 312 on the substrate 1 and the orthographic projection of the second oxide semiconductor pattern 322 on the substrate 1 are both located within the orthographic projection of the gate electrode 2 on the substrate 1, so that the first active layer structure 31 and the gate electrode 2 are formed together as a first sub-Oxide TFT structure, and the second active layer structure 32 and the gate electrode 2 are formed together as a second sub-Oxide TFT structure, so that the oxide thin film transistor provided by the embodiment of the present disclosure is formed as a structure including two sub-Oxide TFTs connected in series.

When the oxide thin film transistor is in operation, a driving signal can be applied to the gate electrode 2 of the oxide thin film transistor, the second conductive connection portion 313 and the fourth conductive connection portion 323, under the control of the driving signal, the first and second sub-Oxide TFTs included in the oxide thin film transistor are both turned on, so that the entire oxide thin film transistor is in an ON state and outputs a driving signal.

It should be noted that the oxide thin film transistor may include a plurality (more than two) of the active layer structures, and the plurality of active layer structures may has a connection relationship similar to the first active layer structure 31 and the second active layer structure 32, such that the plurality of the active layer structures are formed in series, and at the same time, a conductive connecting part at the head end of the series connected structure and a conductive connecting part at the tail end of the series connected structure are used as the two electrodes of the oxide thin film transistor.

According to the specific structure and working process of the above-mentioned oxide thin film transistor, the oxide thin film transistor provided by the embodiments of the present disclosure includes the at least two active layer structures, so that the oxide thin film transistor can for at least two series connected channel structures during operation, so that when the oxide semiconductor pattern in an active layer structure in the oxide thin film transistor deteriorates, it will only affect the performance of the sub-Oxide TFT corresponding to the active layer structure, even if the characteristic curve of this sub-Oxide TFT shifts to the left, the other sub-Oxide TFTs still maintain at a normal working state.

In more detail, when the oxide semiconductor pattern of one sub-Oxide TFT deteriorates, it will cause on-state current Ion and off-state current Ioff of the sub-Oxide TFT to increase. When each sub-Oxide TFT is controlled to be in the on state so that the oxide thin film transistor is turned on as a whole, under the influence of the on-state current Ion of the sub-Oxide TFT, the overall on-state current Ion of the oxide thin film transistor increases, thereby effectively improving the charging capability of the oxide thin film transistor. When the oxide thin film transistor is turned off, each sub-Oxide TFT is in the off state, so even if the off-state current Ioff of the sub-Oxide TFT increase, it cannot flow out through other sub-Oxide TFTs. Therefore, the increased off-state current Ioff will not affect the overall off-state current Ioff of the oxide thin film transistor, so that the overall off-state current Ioff of the oxide thin film transistor can still be maintained at a lower level. Therefore, the oxide thin film transistor provided by the embodiments of the present disclosure not only has higher stability, but also has a stronger driving capability. When the oxide thin film transistor provided by the embodiments of the present disclosure is used to drive the pixels in the display panel to emit light, the display panel will not produce driving bright spots and sand mura defects.

In the oxide thin film transistor provided by the foregoing embodiment, when the at least two active layer structures include the first active layer structure 31 and the second active layer structure 32, the first active layer structure 31 and the second active layer structure 32 have various arrangement, and several specific structures are given below.

Figure 3:
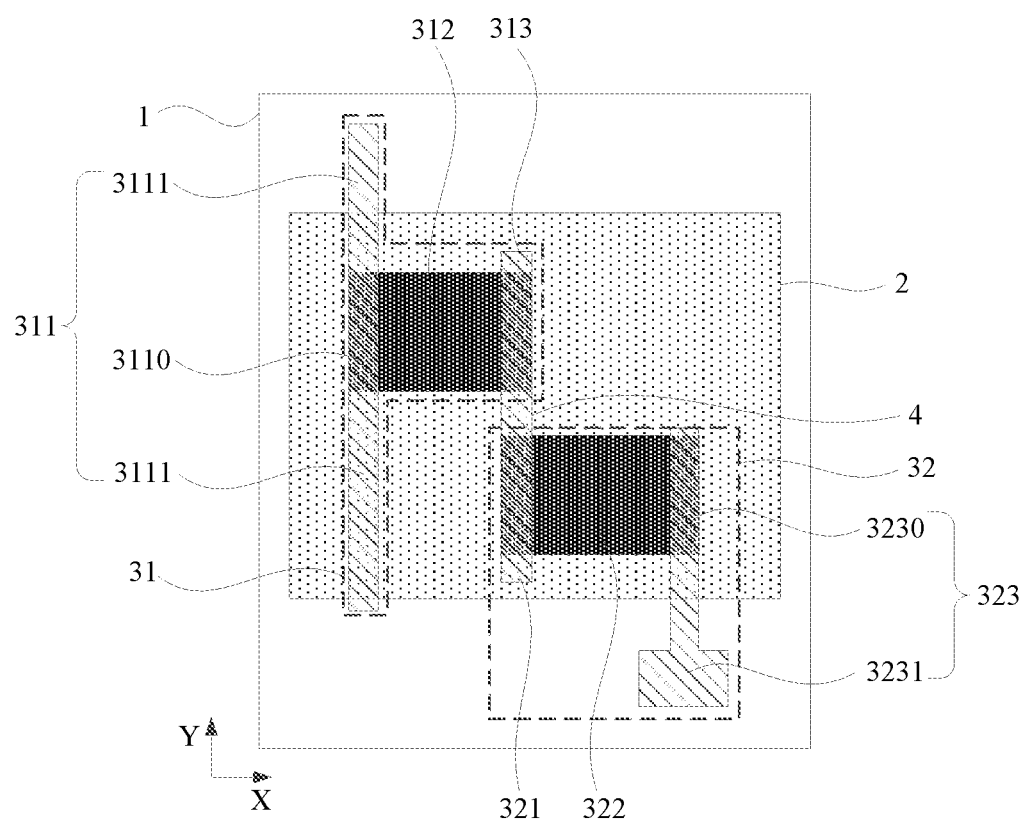
FIG. 3 is a schematic diagram of an oxide thin film transistor in a second structure according to an embodiment of the present disclosure.
Figure 5:
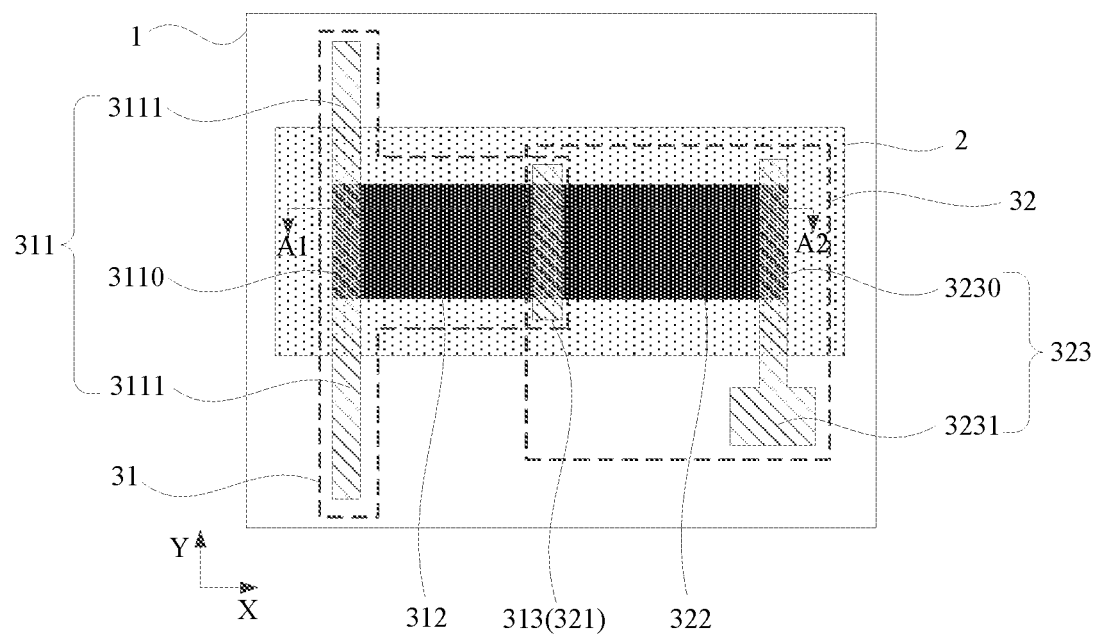
FIG. 5 is a schematic diagram of an oxide thin film transistor in a third structure according to an embodiment of the present disclosure.

As shown in FIGS. 1, 3, and 5, in some embodiments, the orthographic projection of the first conductive connection portion 311 on the substrate 1 and the orthographic projection of the first oxide semiconductor pattern 312 on the substrate have a first overlapping area; the orthographic projection of the second conductive connection portion 313 on the substrate 1 and the orthographic projection of the first oxide semiconductor pattern 312 on the substrate 1 have a second overlapping area; the orthographic projection of the third conductive connection portion 321 on the substrate 1 and the orthographic projection of the second oxide semiconductor pattern 322 on the substrate 1 have a third overlapping area; the orthographic projection of the fourth conductive connecting portion 323 on the substrate 1 and the orthographic projection of the second oxide semiconductor pattern 322 on the substrate 1 have a fourth overlapping area; the second overlapping area and the third overlapping area are located between the first overlapping area and the fourth overlapping area.

Specifically, the first conductive connecting portion 311 and the first oxide semiconductor pattern 312 may be coupled in various ways, and the second conductive connecting portion 313 and the first oxide semiconductor pattern 312 may be coupled in various ways.

Exemplarily, the orthographic projection of the first conductive connection portion 311 on the substrate 1 and the orthographic projection of the first oxide semiconductor pattern 312 on the substrate 1 have the first overlapping area, and the orthographic projection of the second conductive connection portion 313 on the substrate 1 and the orthographic projection of the first oxide semiconductor pattern 312 on the substrate 1 have a second overlapping area. When there is an insulating layer between the conductive connecting portion and the oxide semiconductor pattern, a first via hole can be provided in the insulating layer corresponding to the first overlapping area, and a second via hole can be provided in the insulating layer corresponding to the second overlapping area, so that the first conductive connection portion 311 is coupled to the first oxide semiconductor pattern 312 through the first via hole, and the second conductive connection portion 313 is coupled to the first oxide semiconductor pattern through the second via hole. When there is no insulating layer between the conductive connection portion and the oxide semiconductor pattern, the first conductive connection portion 311 and the second conductive connection portion 313 are directly formed on a surface of the first oxide semiconductor pattern 312 away from the substrate 1, so that the first conductive connection portion 311 can be directly lapped on the first oxide semiconductor pattern in the first overlapping area, and the second conductive connection portion 313 can be directly lapped on the first oxide semiconductor pattern 312 in the second overlapping area.

Similarly, when there is an insulating layer between the conductive connecting portion and the oxide semiconductor pattern, a third via hole can be provided in the insulating layer corresponding to the third overlapping area, and a fourth via hole can be provided in the insulating layer corresponding to the fourth overlapping area, so that the third conductive connection portion 321 is coupled to the second oxide semiconductor pattern 322 through the third via hole, and the fourth conductive connection portion 323 is coupled to the second oxide semiconductor pattern 322 through the fourth via hole. When there is no insulating layer between the conductive connection portion and the oxide semiconductor pattern, the third conductive connection portion 321 and the fourth conductive connection portion 323 are directly formed on the surface of the second oxide semiconductor pattern 322 away from the substrate 1, so that the third conductive connection portion 321 can be directly lapped on the second oxide semiconductor pattern in the third overlapping area, and the fourth conductive connection portion 323 can be directly lapped on the second oxide semiconductor pattern 322 in the fourth overlapping area.

In addition, in the above-mentioned embodiment, the specific positions of the first overlapping area, the second overlapping area, the third overlapping area, and the fourth overlapping area can be set according to actual needs. The second overlapping area and the third overlapping area may be arranged between the first overlapping area and the fourth overlapping area, so that the second conductive connection portion 313 is located close to the third conductive connection portion 321, which facilitate the coupling between the third conductive connection portion 321 and the fourth conductive connection portion 323, and facilitate reducing the area occupied by the oxide thin film transistor.

In the oxide thin film transistor provided by the foregoing embodiment, there are various specific coupling modes between the second conductive connection portion 313 and the third conductive connection portion 321. Several specific coupling modes are listed below.

As shown in FIGS. 1 and 2, in some embodiments, the thin film transistor further includes a first lapping portion 4, and the second conductive connection portion 313 and the third conductive connection portion 321 is coupled to each other through the first lapping portion 4, and the orthographic projection of the first lapping portion 4 on the substrate 1 does not overlap the orthographic projection of the first oxide semiconductor pattern 312 on the substrate 1, and does not overlap with the orthographic projection of the second oxide semiconductor pattern 322 on the substrate 1.

Specifically, when the second conductive connecting portion 313 and the third conductive connecting portion 321 are coupled to each other through the first lapping portion 4, the first lapping portion 4 has various shapes and layouts. For example, the at least two active layer structures are sequentially arranged along a first direction, the first direction is X direction in the coordinate axis, when the first oxide semiconductor pattern 312 and the second oxide semiconductor pattern 322 are arranged along the X direction, the first lapping portion 4 can be set as a stripe pattern extending along the X direction, and the first end of the stripe pattern along the X direction is connected to the second conductive connecting portion 313, the second end of the strip-shaped pattern along the X direction is coupled to the third conductive connecting portion 321. In addition, according to actual needs, the orthographic projection of the first lapping portion 4 on the substrate 1 overlaps or does not overlap the orthographic projection of the first oxide semiconductor pattern 312 on the substrate 1; and the orthographic projection of the first lapping portion 4 on the substrate 1 overlaps or does not overlap the orthographic projection of the second oxide semiconductor pattern 322 on the substrate 1.

In more detail, as shown in FIG. 1, the second conductive connection portion 313 and the third conductive connection portion 321 are both strip-shaped patterns extending along the Y direction in the coordinate axis, and the orthographic projections of the second conductive connection portion 313, the third conductive connecting portion 321 and the first lapping portion 4 on the substrate 1 may form an I-shape/H shape together.

Figure 4:
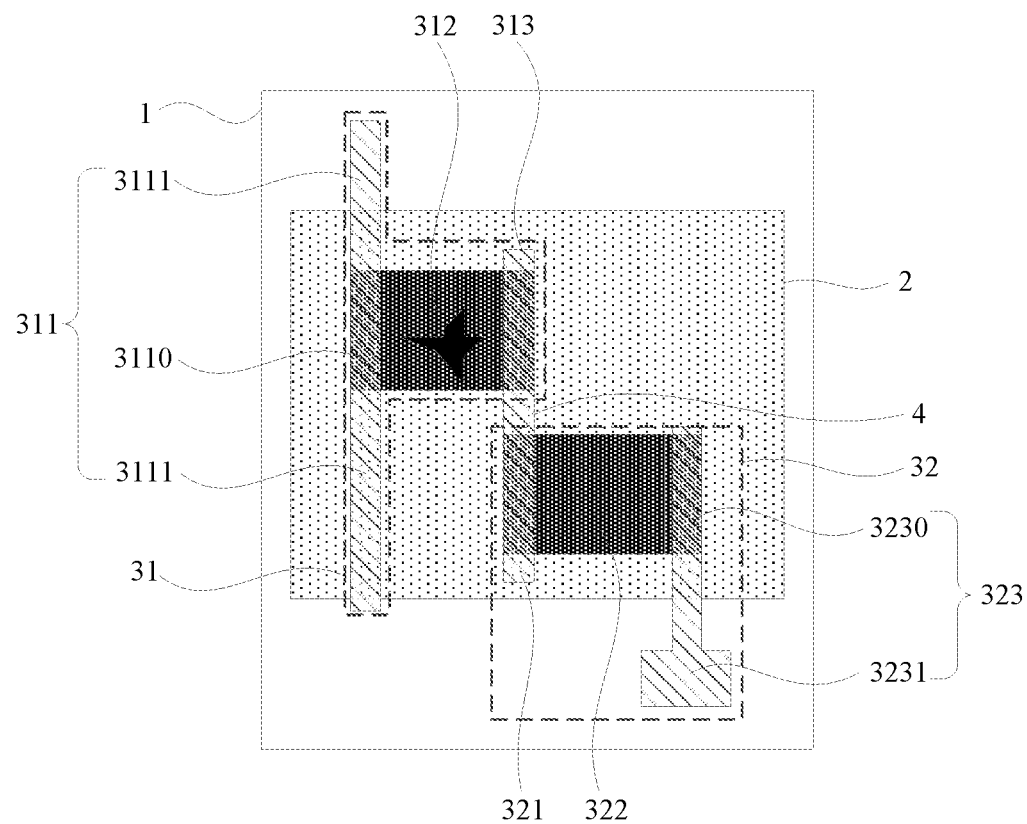
FIG. 4 is a schematic diagram of the deterioration of an active layer of the oxide thin film transistor in the second structure.

As shown in FIG. 3 and FIG. 4, in some embodiments, the first oxide semiconductor pattern 312 and the second oxide semiconductor pattern 322 may be arranged in sequence along a first direction, and are staggered along a second direction perpendicular to the first direction.

Exemplarily, the first direction is the X direction, and the second direction is the Y direction. When the first oxide semiconductor pattern 312 and the second oxide semiconductor pattern 322 are laid out, the first oxide semiconductor pattern 312 and the second oxide semiconductor pattern 322 may be sequentially arranged along the X direction, and are staggered along the Y direction perpendicular to the X direction.

In some embodiments, an orthographic projection of the first oxide semiconductor pattern 312 in the second direction and an orthographic projection of the second oxide semiconductor pattern 322 in the second direction have a fifth overlapping areas, the second conductive connection portion 313, the first lapping portion 4, and the third conductive connection portion 321 are formed as an integrated in-line structure extending along the second direction, the size of the fifth overlapping area in the first direction is the same as the width of the in-line structure in the first direction.

Specifically, when the first oxide semiconductor pattern 312 and the second oxide semiconductor pattern 322 are arranged in sequence along a first direction and are staggered along the second direction perpendicular to the first direction, it can be further set so that the orthographic projection of the first oxide semiconductor pattern 312 in the second direction and the orthographic projection of the second oxide semiconductor pattern 322 in the second direction have a fifth overlapping area, so that the second conductive connecting portion 313, the first lapping portion 4, and the third conductive connecting portion 321 are formed as an integrated in-line structure extending along the second direction, thereby simplifying the manufacturing process to the greatest extent and reducing the layout area of the oxide thin film transistor.

Further, the size of the fifth overlapping area in the first direction can be set to be the same as the width of the in-line structure in the first direction. This arrangement ensures that the second conductive connection portion 313 and the first oxide semiconductor pattern 312 have a larger contact area, and the third conductive connection portion 321 and the second oxide semiconductor pattern 322 have a larger contact area, while minimizing the area occupied by the integrated in-line structure, thereby effectively reducing the space occupied by the oxide thin film transistor while ensuring the operating performance of the oxide thin film transistor.

Figure 6:
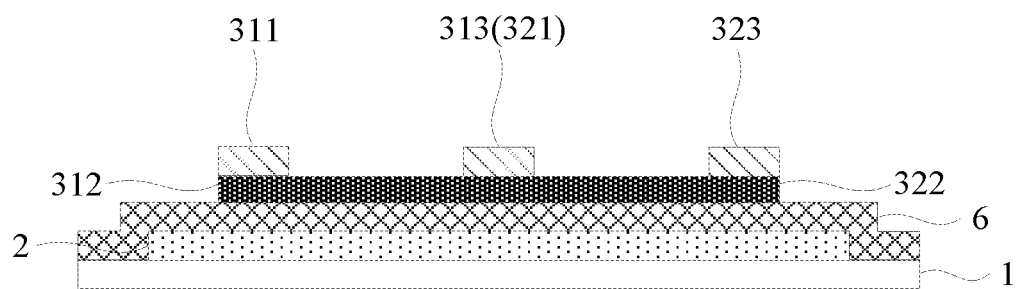
FIG. 6 is a schematic cross-sectional view along the A1-A2 direction in FIG. 5.
Figure 7:
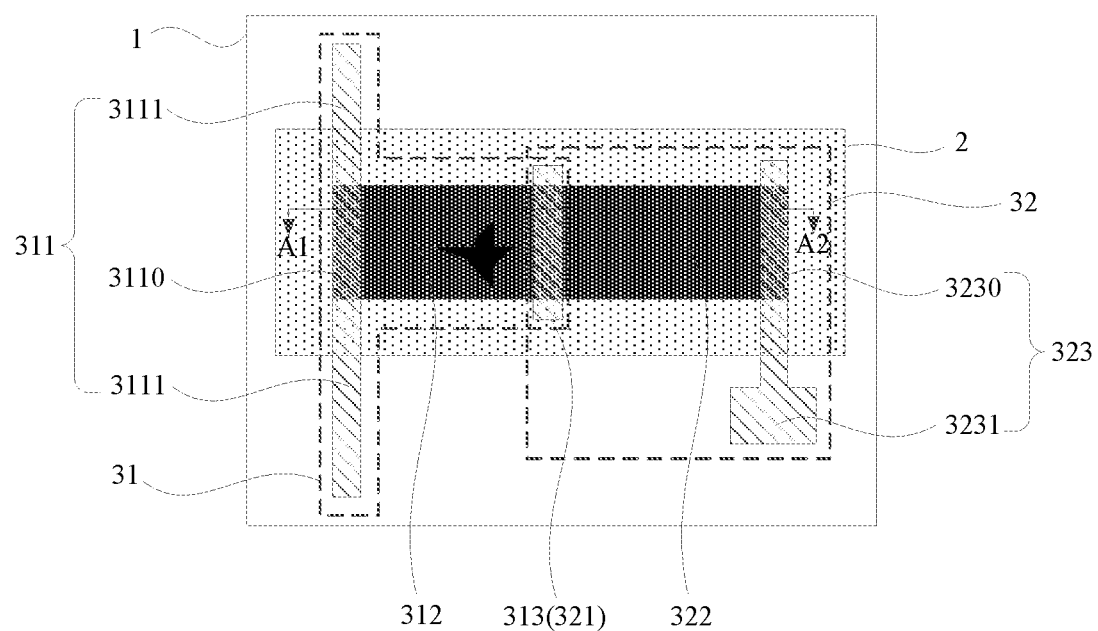
FIG. 7 is a schematic diagram of the deterioration of an active layer of the oxide thin film transistor in the third structure.

As shown in FIGS. 5-7, in some embodiments, the first oxide semiconductor pattern 312 and the second oxide semiconductor pattern 322 may be formed as an integrated structure, and the second conductive connection portion 313 is multiplexed as the third conductive connection portion 321.

Specifically, the first oxide semiconductor pattern 312 and the second oxide semiconductor pattern 322 are formed into an integrated structure, and the second conductive connection portion 313 is multiplexed as the third conductive connection portion 321, which not only makes the area of the oxide semiconductor pattern corresponding to the oxide thin film transistor larger and is more conducive to improving the operating stability of the oxide thin film transistor, but also effectively simplifies patterning process and reducing the space occupied by the oxide thin film transistor when manufacturing the oxide semiconductor pattern 121.

It should be noted that a gate insulating layer 6 is formed between the gate electrode 2 and the oxide semiconductor pattern in FIG. 6.

In the oxide thin film transistor provided by the foregoing embodiment, the first conductive connection portion 311 and the second conductive connection portion 313 have various structures and layouts, and the first conductive connection portion 311 and the second conductive connection portion 313 are described below.

As shown in FIGS. 1, 3, and 5, in some embodiments, the first conductive connecting portion 311 includes a first portion 3110 extending along the second direction, and a second portion 3111 which is extended from the first portion 3110 along the second direction. The orthographic projection of the first portion 3110 on the substrate 1 and the orthographic projection of the first oxide semiconductor pattern 312 on the substrate 1 have the first overlapping area, the orthographic projection of the second portion 3111 on the substrate 1 and the orthographic projection of the first oxide semiconductor pattern 312 on the substrate 1 do not overlap.

Specifically, the first conductive connection portion 311 includes a first portion 3110 and a second portion 3111, the first portion 3110 extends along the second direction, and the orthographic projection of the first portion 3110 on the substrate 1 and the orthographic projection of the first oxide semiconductor pattern 312 on the substrate 1 have the first overlapping area, and the second portion 3111 is extended from the first portion 3110 along the second direction, the orthographic projection of the second portion 3111 on the substrate 1 does not overlap the first oxide semiconductor structure, and the first portion 3110 and the second portion 3111 form an integrated strip structure along the second direction.

Further, it can also be arranged that the width of the first overlapping area is the same as the width of the integrated strip structure along the first direction, but it is not limited to this.

When the first conductive connection portion 311 is formed into the above structure, the first conductive connection portion 311 can be used as the input electrode (such as the drain electrode) of the oxide thin film transistor, which is more convenient for the oxide thin film transistor to be coupled with external terminals.

In some embodiments, the fourth conductive connection portion 323 includes a third portion 3230 and a fourth portion 3231. The third portion 3230 extends along a second direction perpendicular to the first direction. The orthographic projection of the third portion 3230 on the substrate 1 and the orthographic projection of the second oxide semiconductor pattern 322 on the substrate 1 partially overlap to form the fourth overlapping area; the fourth portion 3231 extends along the first direction, the orthographic projection of the fourth portion 3231 on the substrate 1 and the orthographic projection of the second oxide semiconductor pattern 322 on the substrate 1 do not overlap, and the fourth portion 3231 is coupled to the first end of the third portion 3230, and the orthographic projection of the first end on the substrate 1 and the orthographic projection of the second oxide semiconductor pattern 322 on the substrate 1 do not overlap.

Specifically, the fourth conductive connection portion 323 includes a third portion 3230 and a fourth portion 3231, the third portion 3230 extends along the second direction, and the third portion 3230 may include a first sub-portion and a second sub-portion, the orthographic projection of the first sub-portion on the substrate 1 and the orthographic projection of the second oxide semiconductor pattern 322 on the substrate 1 have the fourth overlapping area, the orthographic projection of the second sub-portion on the substrate 1 and the orthographic projection of the second oxide semiconductor pattern 322 on the substrate 1 do not overlap, and the second sub-portion may be extended from the first sub-portion along the second direction.

The fourth portion 3231 extends along the first direction, and the orthographic projection of the fourth portion 3231 on the substrate 1 does not overlap the orthographic projection of the second oxide semiconductor pattern 322 on the substrate 1, the fourth portion 3231 and the third part 3230 have multiple coupling modes. For example, the fourth portion 3231 is coupled to the first end of the third portion 3230, and the orthographic projection of the first end of the third portion 3230 on the substrate 1 and the orthographic projection of the second oxide semiconductor pattern 322 on the substrate 1 do not overlap. In this coupling mode, the third portion 3230 and the fourth portion 3231 are collectively formed as an L-shaped pattern or a T-shaped pattern.

Further, it can also be arranged that along the first direction, the width of the fourth overlapping area is the same as the width of the third portion 3230, but it is not limited to this.

When the fourth conductive connection portion 323 is provided with the above structure, the third portion 3230 and the fourth portion 3231 can be formed into an integrated structure, and the fourth conductive connection portion 323 can be used as the output electrode (such as the source electrode) of the oxide thin film transistor, when the oxide thin film transistor is used as the driving transistor in the pixel driving circuit, which is more conducive to the coupling between the output electrode of the driving transistor and the corresponding light-emitting device.

Figure 8:
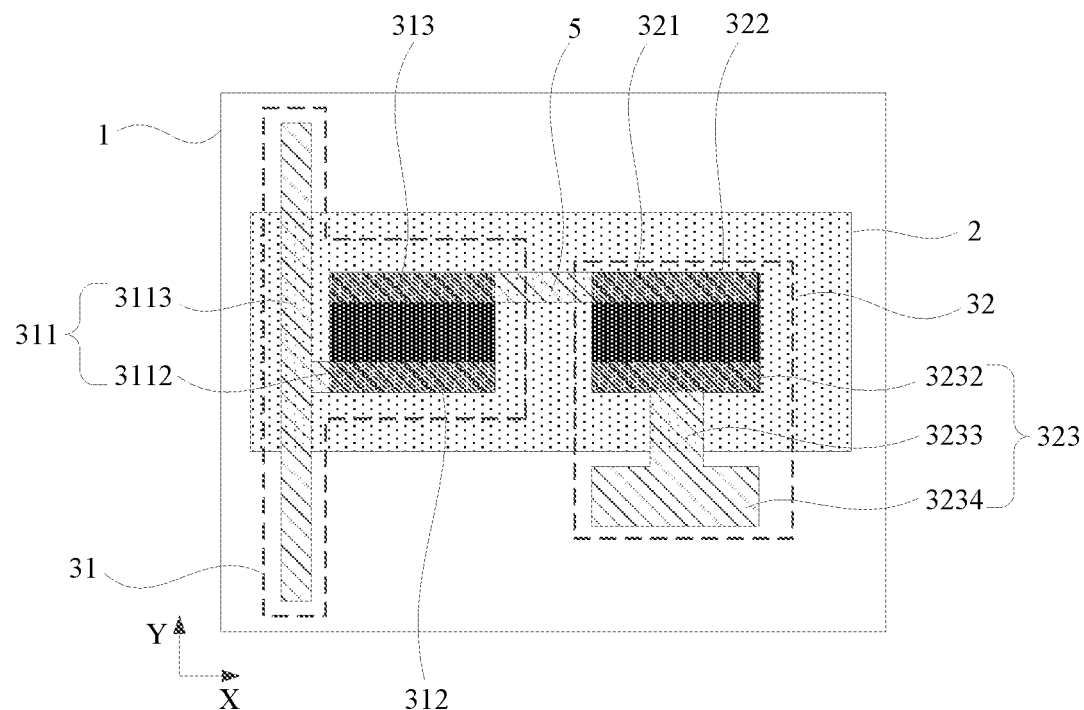
FIG. 8 is a schematic diagram of an oxide thin film transistor in a fourth structure according to an embodiment of the present disclosure.
Figure 9:
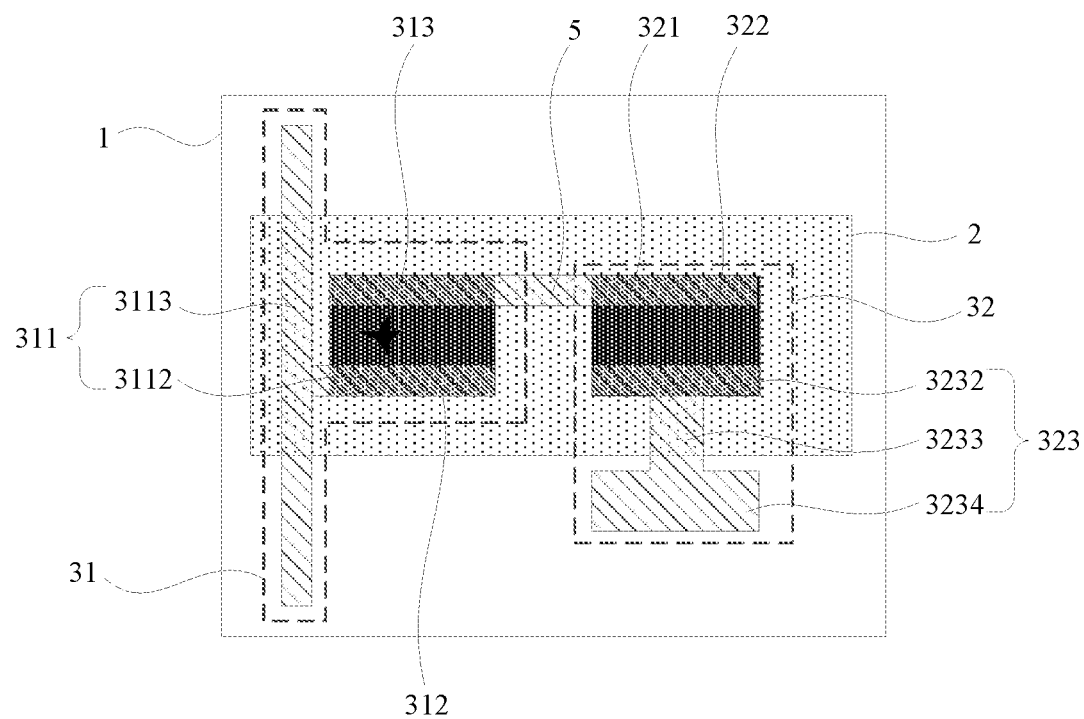
FIG. 9 is a schematic diagram of the deterioration of an active layer of the oxide thin film transistor in the fourth structure.

As shown in FIGS. 8 and 9, in some embodiments, an orthographic projection of the first conductive connection portion 311 on the substrate 1 and the orthographic projection of the first oxide semiconductor pattern 312 on the substrate 1 have the first overlapping area; the orthographic projection of the second conductive connection portion 313 on the substrate 1 and the orthographic projection of the first oxide semiconductor pattern 312 on the substrate 1 have a second overlapping area; the orthographic projection of the third conductive connection portion 321 on the substrate 1 and the orthographic projection of the second oxide semiconductor pattern 322 on the substrate 1 have a third overlapping area; the orthographic projection of the fourth conductive connecting portion 323 on the substrate 1 and the orthographic projection of the second oxide semiconductor pattern 322 on the substrate 1 have a fourth overlapping area. In the second direction perpendicular to the first direction, the second overlapping area and the third overlapping area are located on a first side of the first oxide semiconductor pattern 312, and the first overlapping area and the fourth overlapping area are located on a second side of the second oxide semiconductor pattern 322, and the first side and the second side are opposite to each other along the second direction.

Specifically, when there is an insulating layer between the conductive connection portion and the oxide semiconductor pattern, a first via hole can be provided in the insulating layer corresponding to the first overlapping area, and a second via hole can be provided in the insulating layer corresponding to the second overlapping area, so that the first conductive connection portion 311 is coupled to the first oxide semiconductor pattern 312 through the first via hole, and the second conductive connection portion 313 is coupled to the first oxide semiconductor pattern 312 through the second via hole. When there is no insulating layer between the conductive connection portion and the oxide semiconductor pattern, that is, the first conductive connection portion 311 and the second conductive connection portion 313 are directly formed on a surface of the first oxide semiconductor pattern 312 away from the substrate 1, so that the first conductive connection portion 311 can be directly lapped on the first oxide semiconductor pattern in the first overlapping region and the second conductive connection portion 313 can be directly lapped on the first oxide semiconductor pattern 312 in the second overlapping area.

Similarly, when there is an insulating layer between the conductive connecting portion and the oxide semiconductor pattern, a third via hole can be provided in the insulating layer corresponding to the third overlapping area, and a fourth via hole can be provided in the insulating layer corresponding to the fourth overlapping area, so that the third conductive connection portion 321 is coupled to the second oxide semiconductor pattern 322 through the third via hole, and the fourth conductive connection portion 323 is coupled to the second oxide semiconductor pattern 322 through the fourth via hole; and when there is no insulating layer between the conductive connection portion and the oxide semiconductor pattern, that is, the third conductive connection portion 321 and the fourth conductive connection portion 323 are directly formed on a surface of the second oxide semiconductor pattern 322 away from the substrate 1, so that the third conductive connection portion 321 can be directly lapped on the second oxide semiconductor pattern in the third overlapping area, and the fourth conductive connection portion 323 can be directly lapped on the second oxide semiconductor pattern 322 in the fourth overlapping area.

In addition, in the above-mentioned embodiment, the specific positions of the first overlapping area, the second overlapping area, the third overlapping area, and the fourth overlapping area can be set according to actual needs, for example, can be arranged in the second direction, the second overlapping area and the third overlapping area are located on the first side of the first oxide semiconductor pattern 312, and the first overlapping area and the fourth overlapping area are located on the second side of the second oxide semiconductor pattern 322, and the first side and the second side are opposite to each other along the second direction. In this structure, a channel region generated by the first oxide semiconductor pattern 312 and a channel region generated by the second oxide semiconductor pattern 322 are independent of each other, thereby avoiding interference between adjacent channel regions during operation. Moreover, this structure also makes the distance between the second conductive connection portion 313 and the third conductive connection portion 321 closer, which is not only more convenient for the coupling between the second conductive connection portion 313 and the third conductive connecting portion 321, but also more conducive to reducing the area occupied by the oxide thin film transistor.

As shown in FIGS. 8 and 9, the thin film transistor further includes a second lapping portion 5, and the second conductive connection portion 313 and the third conductive connection portion 321 are coupled through the second lapping portion 5, the orthographic projection of the second lapping portion 5 on the substrate 1 does not overlap the orthographic projection of the first oxide semiconductor pattern 312 on the substrate 1, and does not overlap the orthographic projection of the second oxide semiconductor pattern 322 on the substrate 1; the second conductive connection portion 313, the second lapping portion 5, and the third conductive connection portion 321 can be formed in an in-line structure along the first direction.

Specifically, when the second conductive connecting portion 313 and the third conductive connecting portion 321 are coupled by the second lapping portion, the specific shape and layout of the second lapping portion 5 are various. For example, the first direction is the X direction in the coordinate axis, when the first oxide semiconductor pattern 312 and the second oxide semiconductor pattern 322 are arranged along the X direction, the second lapping portion 5 is a strip-shaped pattern extending along the X direction, and the second conductive connecting portion 313 and the third conductive connecting portion 321 are both strip-shaped patterns extending along the X direction. The first end of the second lapping portion 5 along the X direction is coupled to the second conductive connecting portion 313, and the second end of the second lapping portion 5 along the X direction is coupled to the third conductive connection portion 321, so that the second conductive connecting portion 313, the second lapping portion 5, and the third conductive connecting portion 321 can be formed in an in-line structure along the X direction.

In addition, according to actual needs, the orthographic projection of the second lapping portion 5 on the substrate 1 and the orthographic projection of the first oxide semiconductor pattern 312 on the substrate 1 overlap or do not to overlap. And the orthographic projection of the second lapping portion 5 on the substrate 1 and the orthographic projection of the second oxide semiconductor pattern 322 on the substrate 1 overlap or do not overlap.

In addition, the above-mentioned in-line structure formed by the second conductive connection portion 313, the second lapping portion 5, and the third conductive connection portion 321 can also be formed into an integrated structure, so that the in-line structure is formed by one patterning process, thereby effectively simplifying the manufacturing process of the oxide thin film transistor and saving the manufacturing cost of the oxide thin film transistor.

As shown in FIG. 8, it can be further provided that the first conductive connection portion 311 includes a fifth portion 3112 and a sixth portion 3113 that are coupled to each other, and the fifth portion 3112 extends along the first direction, so that the orthographic projection of the fifth portion 3112 on the substrate 1 and the orthographic projection of the first oxide semiconductor pattern 312 on the substrate 1 have the first overlapping area; the sixth portion 3113 extends along the second direction, the orthographic projection of the sixth portion 3113 on the substrate 1 and the orthographic projection of the first oxide semiconductor pattern 312 on the substrate 1 do not overlap.

Specifically, the first conductive connection portion 311 may include a fifth portion 3112 and a sixth portion 3113 coupled to each other, the fifth portion 3112 may extend along the first direction, and the orthographic projection of the fifth portion 3112 on the substrate 1 and the orthographic projection of the first oxide semiconductor pattern 312 on the substrate 1 partially overlap to form the first overlapping area; the sixth portion 3113 may extend along the second direction, the orthographic projection of the sixth portion 3113 on the substrate 1 and the orthographic projection of the first oxide semiconductor pattern 312 on the substrate 1 do not overlap, and the sixth portion 3113 can be coupled to the first end of the fifth portion 3112, and the orthographic projection of the first end on the substrate 1 and the orthographic projection of the first oxide semiconductor pattern 312 on the substrate do not overlap, the first conductive connecting portion 311 formed after the fifth portion 3112 is coupled to the sixth portion 3113 may be of an L shape or T shape.

In addition, along the second direction, the width of the first overlapping area is the same as the width of the fifth portion 3112, but it is not limited to this.

When the first conductive connection portion 311 is formed into the above structure, the first conductive connection portion 311 can be used as the input electrode (such as the drain electrode) of the oxide thin film transistor, which is more convenient for the oxide thin film transistor to be coupled to external terminals.

Further, the fourth conductive connecting portion 323 includes a seventh portion 3232, an eighth portion 3233, and a ninth portion 3234; the seventh portion 3232 extends along the first direction, and the orthographic projection of the seventh portion 3232 on the substrate 1 and the orthographic projection of the second oxide semiconductor pattern 322 on the substrate 1 have the fourth overlapping area; the ninth portion 3234 extends along the first direction, the orthographic projection of the ninth portion 3234 on the substrate 1 and the orthographic projection of the second oxide semiconductor pattern 322 on the substrate 1 do not overlap; the eighth portion 3233 extends along the second direction, the orthographic projection of the eighth portion 3233 on the substrate 1 is located between the orthographic projection of the seventh portion 3232 on the substrate 1 and the orthographic projection of the ninth portion 3234 on the substrate 1, and does not overlap the orthographic projection of the second oxide semiconductor pattern 322 on the substrate 1. The seventh portion 3232 is coupled to the ninth portion 3234 through the eighth portion 3233.

Specifically, the fourth conductive connecting portion 323 may include a seventh portion 3322, an eighth portion 3233, and a ninth portion 3234, the seventh portion 3232 extends along the first direction, and the orthographic projection of the seventh portion 3232 on the substrate 1 and the orthographic projection of the second oxide semiconductor pattern 322 on the substrate 1 have the fourth overlapping area. Further, the orthographic projection of the seventh portion 3232 on the substrate 1 is located within the orthographic projection of the second oxide semiconductor pattern 322 on the substrate 1.

Along the second direction, the ninth portion 3234 can be arranged opposite to the seventh portion 3232, the ninth portion 3234 extends along the first direction, and the orthographic projection of the ninth portion 3234 on the base 1 and the orthographic projection of the second oxide semiconductor pattern 322 on the substrate 1 do not overlap.

The eighth portion 3233 extends along the second direction, and the orthographic projection of the eighth portion 3233 on the substrate 1 is located between the orthographic projection of the seventh portion 3232 on the substrate 1 and the orthographic projection of the ninth portion 3234 on the substrate 1, one end of the eighth portion 3233 close to the seventh portion 3232 is coupled to the seventh portion 3232, and one end of the eighth portion 3233 close to the ninth portion 3234 is coupled to the ninth portion 3234, so that the fourth conductive connecting portion 323 formed by the seventh portion 3322, the eighth portion 3233, and the ninth portion 3234 is of an I shape/H shape.

It is also worth noting that, according to actual needs, the orthographic projection of the eighth portion 3233 on the substrate 1 and the orthographic projection of the second oxide semiconductor pattern 322 on the substrate 1 overlap or do not overlap.

Further, along the second direction, the width of the ninth portion 3234 is greater than the width of the seventh portion 3232, so as to ensure a better connection performance between the fourth conductive connecting portion 323 and the outside.

When the fourth conductive connecting portion 323 is provided with the above structure, the seventh portion 3232, the eighth portion 3233, and the ninth portion 3234 can be formed into an integrated structure, and the fourth conductive connecting portion 323 is used as the output electrode (such as the source electrode) of the oxide thin film transistor, so that when the thin film transistor is used as the driving transistor in the pixel driving circuit, it is more conducive to the coupling between the output electrode of the driving transistor and the corresponding light-emitting element.

The oxide thin film transistor provided by the foregoing embodiments includes the oxide semiconductor patterns in each of the active layer structures that are arranged in various ways. In some embodiments, the oxide semiconductor patterns in each of the active layer structures are arranged in the same layer and made of the same material. Specifically, the first oxide semiconductor pattern 312 and the second oxide semiconductor pattern 322 may be arranged in the same layer and made of the same material.

When the oxide semiconductor patterns in each active layer structure are arranged in the same layer and made of the same material, the step of manufacturing the oxide semiconductor patterns in each active layer structure specifically includes: manufacturing an oxide semiconductor thin film using an oxide semiconductor material; forming a photoresist covering the oxide semiconductor thin film, and then exposing the photoresist using a mask including a light-transmitting area and a light-shielding area to form a photoresist reserved area and a photoresist removed area, in which the photoresist reserved area corresponds to an area where the oxide semiconductor pattern in each active structure is located, and the photoresist removed area corresponds to an area other than the area where the oxide semiconductor pattern in each active structure is located; removing the photoresist located in the photoresist removed area by a developer to expose the oxide semiconductor film located in the photoresist removed area, and then removing the exposed oxide semiconductor film by an etching process, and finally peeling off the remaining photoresist to form the oxide semiconductor pattern in each active layer structure.

In the foregoing arrangement, the oxide semiconductor patterns in the active layer structures are arranged in the same layer and made of the same material, so that the oxide semiconductor patterns in the active layer structures are formed at the same time through a single patterning process, thereby effectively simplifying the above manufacturing process of the oxide thin film transistor, and reducing the production cost.

It should be noted that the above-mentioned "the same layer" refers to a layer structure formed by using the same film forming process to form a film layer with a specific pattern, and then using the same mask plate through a single patterning process. Depending on the specific pattern, a single patterning process may include multiple exposure, development or etching processes, and the specific patterns in the formed layer structure may be continuous or discontinuous, and these specific patterns may also be at different heights or have different thicknesses.

When the oxide semiconductor patterns in each active layer structure are arranged in the same layer and made of the same material, the step of manufacturing the oxide semiconductor patterns in each active layer structure may include: forming the oxide semiconductor film layer of each oxide semiconductor pattern using a same film forming process; then patterning the oxide semiconductor film layer through a single patterning process, and forming the oxide semiconductor patterns in the active layer structures are formed at the same time.

In the oxide thin film transistor provided by the foregoing embodiment, the specific arrangement of the first conductive connection portion 311, the second conductive connection portion 313, the third conductive connection portion 321, and the fourth conductive connection portion 323 are various. For example, the first conductive connection portion 311, the second conductive connection portion 313, the third conductive connection portion 321, and the fourth conductive connection portion 323 are arranged in the same layer and made of the same material.

Specifically, the first conductive connection portion 311, the second conductive connection portion 313, the third conductive connection portion 321, and the fourth conductive connection portion 323 are arranged in the same layer and made of the same material, so that the first conductive connection portion 311, the second conductive connection portion 313, the third conductive connection portion 321, and the fourth conductive connection portion 323 can be formed simultaneously in the same patterning process, thereby effectively simplifying the manufacturing process of the oxide thin film transistor.

The embodiments of the present disclosure also provide a display device, including the oxide thin film transistors provided in the above embodiments.

Since the oxide thin film transistor provided by the foregoing embodiments not only has higher stability, but also has a strong driving capability, when the oxide thin film transistor provided by the embodiments of the present disclosure is used to drive the pixels in the display panel to emit light, it is avoided that the display panel generates driving bright spots and sand mura defects. Therefore, when the display device provided by the embodiments of the present disclosure includes the above-mentioned oxide thin film transistors, it can also avoid the generation of driving bright spots and sand mura defects.

In addition, since the oxide thin film transistor provided by the foregoing embodiment has the advantages of simple manufacturing process, lower manufacturing cost, and smaller overall occupied area, when the display device provided by the embodiment of the present disclosure includes the foregoing oxide thin film transistor, the display device also has the beneficial effects of simple manufacturing process, low manufacturing cost, and high resolution.

It should be noted that the display device may be any product or component with a display function, such as a TV, a monitor, a digital photo frame, a mobile phone, a tablet computer, and so on.

The embodiments of the present disclosure also provide a method of driving an oxide thin film transistor, which is used to drive the oxide thin film transistor provided in the above embodiment, and the driving method includes: applying a driving signal to a gate electrode 2 of the oxide thin film transistor 2, a second conductive connection portion 313 included in a first active layer structure 31, and a fourth conductive connection portion 323 included in a second active layer structure 32, so that the oxide thin film transistor is turned on.

Specifically, when the oxide thin film transistor is in operation, the driving signal is applied to the gate electrode 2 of the oxide thin film transistor, the first conductive connection portion 313 included in the first active layer structure 31, and the fourth conductive connection portion 323 included in the second active layer structure 32. Under the control of the driving signal, each sub-Oxide TFT included in the oxide thin film transistor is turned on, so that the entire oxide thin film transistor is turned on and outputs the driving signal.

When the oxide thin film transistor is driven by the driving method provided by the embodiment of the present disclosure, since the oxide thin film transistor includes at least two active layer structures, so that when the oxide thin film transistor is in operation, at least series-connected channel structures are formed, when the oxide semiconductor pattern in one active layer structure of the oxide thin film transistor deteriorates, as shown in FIGS. 2, 4, 7 and 9, the performance of only the sub-Oxide TFT corresponding to the source layer structure will be affected, which makes that even if the characteristic curve of the sub-Oxide TFT shift to the left, other sub-Oxide TFTs still maintain at a normal working state.

In more detail, when the oxide semiconductor pattern of one sub-Oxide TFT deteriorates, it will cause on-state current Ion and off-state current Ioff of the sub-Oxide TFT to increase, thus each sub-Oxide TFT is controlled to be in the on state. When the oxide thin film transistor is turned on as a whole, under the influence of the on-state current Ion of the sub-Oxide TFT, the overall on-state current Ion of the oxide thin film transistor increases, thereby effectively improving the charging capability of the oxide thin film transistor. When the oxide thin film transistor is in the off state, each sub-Oxide TFT is in the off state, so even if the off-state current Ioff of the sub-Oxide TFT increases, it cannot flow out from the oxide thin film transistor through other sub-Oxide TFTs. Therefore, the increased off-state current Ioff will not affect the overall off-state current Ioff of the oxide thin film transistor, so that the overall off-state current Ioff of the oxide thin film transistor can still be maintained at a low level. Therefore, when the oxide thin film transistor is driven by the driving method provided by the embodiment of the present disclosure, the oxide thin film transistor not only has higher stability, but also has a stronger driving capability. When the oxide thin film transistor is used to drive the pixels in the display panel to emit light, it is avoided that the display panel generates driving bright spots and sand mura defects.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An oxide thin film transistor, comprising:
a gate electrode arranged on a substrate; and
at least two active layer structures,
wherein the at least two active layer structures include a first active layer structure and a second active layer structure,
the first active layer structure includes a first conductive connection portion and a second conductive connection portion arranged oppositely, and a first oxide semiconductor pattern arranged between the first conductive connection portion and the second conductive connection portion, the first oxide semiconductor pattern is respectively coupled to the first conductive connection portion and the second conductive connection portion,
the second active layer structure includes a third conductive connection portion and a fourth conductive connection portion arranged oppositely, and a second oxide semiconductor pattern arranged between the third conductive connection portion and the fourth conductive connection portion, and the second oxide semiconductor pattern is respectively connected to the third conductive connection portion and the fourth conductive connection portion, and
an orthographic projection of the first oxide semiconductor pattern on the substrate and an orthographic projection of the second oxide semiconductor pattern on the substrate are both located within an orthographic projection of the gate electrode on the substrate, the second conductive connection portion is coupled to the third conductive connection portion;
wherein an orthographic projection of the first conductive connection portion on the substrate and the orthographic projection of the first oxide semiconductor pattern on the substrate have a first overlapping area;
an orthographic projection of the second conductive connection portion on the substrate and the orthographic projection of the first oxide semiconductor pattern on the substrate have a second overlapping area;
an orthographic projection of the third conductive connection portion on the substrate and the orthographic projection of the second oxide semiconductor pattern on the substrate have a third overlapping area;
an orthographic projection of the fourth conductive connecting portion on the substrate and the orthographic projection of the second oxide semiconductor pattern on the substrate have a fourth overlapping area;
the second overlapping area and the third overlapping area are located between the first overlapping area and the fourth overlapping area;
wherein the oxide thin film transistor further comprises a first lapping portion, and the second conductive connection portion and the third conductive connection portion are coupled to each other through the first lapping portion, and an orthographic projection of the first lapping portion on the substrate does not overlap the orthographic projection of the first oxide semiconductor pattern on the substrate, and does not overlap with the orthographic projection of the second oxide semiconductor pattern on the substrate;
wherein the first oxide semiconductor pattern and the second oxide semiconductor pattern are sequentially arranged along a first direction, and are staggered along a second direction perpendicular to the first direction.

2. The oxide thin film transistor according to claim 1, wherein an orthographic projection of the first oxide semiconductor pattern in the second direction and an orthographic projection of the second oxide semiconductor pattern in the second direction have a fifth overlapping areas, the second conductive connection portion, the first lapping portion, and the third conductive connection portion are formed as an integrated in-line structure extending along the second direction.

3. The oxide thin film transistor according to claim 2, wherein a size of the fifth overlapping area in the first direction is the same as a width of the integrated in-line structure in the first direction.

4. The oxide thin film transistor according to claim 1, wherein the at least two active layer structures extend along a first direction, the first conductive connection portion includes a first portion and a second portion, the first portion extends along a second direction perpendicular to the first direction, the second portion is extended from the first portion along the second direction, an orthographic projection of the first portion on the substrate and the orthographic projection of the first oxide semiconductor pattern on the substrate have the first overlapping area, and an orthographic projection of the second portion on the substrate does not overlap the orthographic projection of the first oxide semiconductor pattern on the substrate,
wherein the first portion and the second portion form an integrated strip structure along the second direction,
wherein a width of the first overlapping area is the same as a width of the integrated strip structure in the first direction.

5. The oxide thin film transistor according to claim 1, wherein the at least two active layer structures extend along a first direction, the fourth conductive connection portion includes a third portion and a fourth portion, the third portion extends along a second direction perpendicular to the first direction, an orthographic projection of the third portion on the substrate and the orthographic projection of the second oxide semiconductor pattern on the partially overlap to form a fourth overlapping area;
the fourth portion extends along the first direction, an orthographic projection of the fourth portion on the substrate and the orthographic projection of the second oxide semiconductor pattern on the substrate do not overlap, and the fourth portion is coupled to a first end of the third portion, and an orthographic projection of the first end on the substrate and the orthographic projection of the second oxide semiconductor pattern on the substrate do not overlap.

6. The oxide thin film transistor according to claim 5, wherein the third portion includes a first sub-portion and a second sub-portion, an orthographic projection of the first sub-portion on the substrate and the orthographic projection of the second oxide semiconductor pattern on the substrate have the fourth overlapping area, an orthographic projection of the second sub-portion on the substrate and the orthographic projection of the second oxide semiconductor pattern on the substrate do not overlap,
- wherein the third portion and the fourth portion are collectively formed as an L-shaped pattern or a T-shaped pattern, or
- wherein a width of the fourth overlapping region is the same as a width of the third portion in the first direction, or
- wherein the third portion and the fourth portion are formed as an integral structure.

7. The oxide thin film transistor according to claim 1, wherein the first oxide semiconductor pattern and the second oxide semiconductor pattern are arranged at a same layer and made of a same material; or
- wherein the first conductive connection portion, the second conductive connection portion, the third conductive connection portion, and the fourth conductive connection portion are arranged at a same layer and made of a same material.

* * * * *